United States Patent [19]

Lou

[11] Patent Number: 5,432,818
[45] Date of Patent: Jul. 11, 1995

[54] METHOD AND APPARATUS OF JOINT ADAPTIVE CHANNEL ENCODING, ADAPTIVE SYSTEM FILTERING, AND MAXIMUM LIKELIHOOD SEQUENCE ESTIMATION PROCESS BY MEANS OF AN UNKNOWN DATA TRAINING

[76] Inventor: Yuang Lou, 87 Francis St., Apt. #1, Brookline, Mass. 02146

[21] Appl. No.: 18,030

[22] Filed: Feb. 16, 1993

[51] Int. Cl.[6] .................. H03H 7/30; H04L 27/06; H04L 7/00
[52] U.S. Cl. .................. 375/324; 375/233; 375/355; 375/340
[58] Field of Search .................. 375/106, 39, 94, 99, 375/103, 14, 58, 59, 60, 13, 17, 18, 355, 265, 324, 340, 229, 232, 233, 346, 285, 290, 296, 263, 261; 364/724.19, 724.20; 371/43

[56] References Cited

U.S. PATENT DOCUMENTS

| | | | |
|---|---|---|---|
| 4,227,152 | 10/1980 | Godard et al. | 375/13 |
| 4,599,732 | 7/1986 | LeFever | 375/13 |
| 4,789,952 | 12/1988 | Lo et al. | 364/724.2 |
| 5,113,411 | 5/1992 | Yoshida et al. | 375/13 |
| 5,117,291 | 5/1992 | Fadavi-Ardekani et al. | 358/167 |
| 5,119,400 | 6/1992 | Koch | 375/12 |

OTHER PUBLICATIONS

Sato, Y., "A Method of Self-Recovering Equalization for Multilevel Amplitude Modulation Systems," IEEE Transactions on Communications, vol. COM-23, No. 6, Jun. 1975, pp. 679-682.

Godard, D. N., "Self Recovering Equalization and Carrier Tracking in Two Dimensional Data Communication Systems," IEEE Transactions on Communications, vol. COM-28, No. 11, Nov. 1980, pp. 1867-1875.

Sethares, W. A., G. A. Rey and C. R. Johnson, Jr., "Approaches to Blind Equalization of Signals with Multiple Modulus," Proceedings of the IEEE International Conference on Acoustics, Speech, and Signal Processing, vol. 2, 1989, pp. 972-975.

Chen, Y., C. L. Nikias, and J. G. Proakis, "Blind Equalization with Criterion with Memory Nonlinearity," Optical Engineering, vol. 31, No. 6, Jun. 1992, pp. 1200-1210.

Jablon, Neil K., "Joint Blind Equalization, Carrier Recovery, and Timing Recovery for High-Order QAM Signal Constellations," IEEE Transactions on Signal Processing, vol. 40, No. 6, Jun. 1992, pp. 1383-1398.

(List continued on next page.)

Primary Examiner—Stephen Chin
Assistant Examiner—Tesfaldet Bocure

[57] ABSTRACT

A method and apparatus for detecting, with an unknown data training, high-rate data signals coming through a digital communication system whose characteristics is dynamic and unknown. The method underlying the present invention is based on an error estimation criterion which has embodied the emphasis on system characteristics. By means of this method, an apparatus is able to track the characteristics of a pre-designed partial response signaling system automatically, thereby to effect an adaptive control over the characteristics of the digital communication system described above with an unknown data training. In accordance with the first embodiment of the present invention, an adaptive convolutional channel encoding process is jointly operated with an adaptive system filtering process which tracks the characteristics of the pre-designed partial response signaling system automatically with an unknown data training. In according with the second embodiment of the present invention, an adaptive maximum likelihood sequence search of transmitted data symbols in a Trellis state diagram is jointly optimized with the adaptive convolutional channel encoding and the adaptive system filtering process described in the first embodiment of the present invention. The adaptive receiver with an unknown data training described in the present invention is reliable in the sense that minimized error probability is reached in the sequence search of transmitted data symbols and is flexible in the sense that it has no adverse effects on the operations of a communication network.

12 Claims, 7 Drawing Sheets

OTHER PUBLICATIONS

Lou, Y., "Channel Estimation Standard and Adaptive Blind Equalization," Proceedings of the IEEE International Symposium on Circuits and Systems, San Diego, Calif., U.S.A., May 1992, vol. 2, pp. 505–508.

Lou, Y., "Comparison of Adaptive Blind Equalizers," Proceedings of the IEEE International Conference on Acoustics, Speech and Signal Processing, San Francisco, Calif., U.S.A., Mar. 1992, vol. IV, pp. 545–548.

Ding, Z., R. A. Kennedy, B. D. O. Anderson, and C. R. Johnson, Jr., "Ill Convergence of Godard Blind Equalizers in Data Communication Systems," IEEE Transactions on Communications, vol. COM-39, No. 9, Sep. 1991, pp. 1313–1327.

Ungerboeck, G., "Adaptive Maximum Likelihood Receiver for Carrier-Modulated Data-Transmission Systems," IEEE Transactions on Communications, vol. COM-22, No. 5, May 1974, pp. 624–636.

Forney, G. D., Jr., "Maximum Likelihood Sequence Estimation of Digital Sequences in the Presence of Intersymbol Interference," IEEE Transactions on Information Theory, vol. IT-18, No. 3, May 1972, pp. 363–377.

Forney, G. D., Jr., "The Viterbi Algorithm," Proceedings of the IEEE, vol. 61, No. 3, Mar. 1973, pp. 268–278.

JOINT ADAPTIVE TIMING RECOVERY LOOP

| Previous State ($\{l_{k-1}\}$) | Possible Current States ($\{l_k\}$) | Previous State ($\{l_{k-1}\}$) | Possible Current States ($\{l_k\}$) |
|---|---|---|---|
| (-6, 6) | (i,j) for i = -6,-4,-2,0 and j = 0,2,4,6 | ( 0,-4) | (i,j) for i = -6,-4,-2,0,2,4,6 and j = -6,-4,-2,0,2 |
| (-6, 4) | (i,j) for i = -6,-4,-2,0 and j = -2,0,2,4,6 | ( 0,-6) | (i,j) for i = -6,-4,-2,0,2,4,6 and j = -6,-4,-2,0 |
| (-6, 2) | (i,j) for i = -6,-4,-2,0 and j = -4,-2,0,2,4,6 | ( 2, 6) | (i,j) for i = -4,-2,0,2,4,6 and j = 0,2,4,6 |
| (-6, 0) | (i,j) for i = -6,-4,-2,0 and j = -6,-4,-2,0,2,4,6 | ( 2, 4) | (i,j) for i = -4,-2,0,2,4,6 and j = -2,0,2,4,6 |
| (-6,-2) | (i,j) for i = -6,-4,-2,0 and j = -6,-4,-2,0,2,4 | ( 2, 2) | (i,j) for i = -4,-2,0,2,4,6 and j = -4,-2,0,2,4,6 |
| (-6,-4) | (i,j) for i = -6,-4,-2,0 and j = -6,-4,-2,0,2 | ( 2, 0) | (i,j) for i = -4,-2,0,2,4,6 and j = -6,-4,-2,0,2,4,6 |
| (-6,-6) | (i,j) for i = -6,-4,-2,0 and j = -6,-4,-2,0 | ( 2,-2) | (i,j) for i = -4,-2,0,2,4,6 and j = -6,-4,-2,0,2,4 |
| (-4, 6) | (i,j) for i = -6,-4,-2,0,2 and j = 0,2,4,6 | ( 2,-4) | (i,j) for i = -4,-2,0,2,4,6 and j = -6,-4,-2,0,2 |
| (-4, 4) | (i,j) for i = -6,-4,-2,0,2 and j = -2,0,2,4,6 | ( 2,-6) | (i,j) for i = -4,-2,0,2,4,6 and j = -6,-4,-2,0 |
| (-4, 2) | (i,j) for i = -6,-4,-2,0,2 and j = -4,-2,0,2,4,6 | ( 4, 6) | (i,j) for i = -2,0,2,4,6 and j = 0,2,4,6 |
| (-4, 0) | (i,j) for i = -6,-4,-2,0,2 and j = -6,-4,-2,0,2,4,6 | ( 4, 4) | (i,j) for i = -2,0,2,4,6 and j = -2,0,2,4,6 |
| (-4,-2) | (i,j) for i = -6,-4,-2,0,2 and j = -6,-4,-2,0,2,4 | ( 4, 2) | (i,j) for i = -2,0,2,4,6 and j = -4,-2,0,2,4,6 |
| (-4,-4) | (i,j) for i = -6,-4,-2,0,2 and j = -6,-4,-2,0,2 | ( 4, 0) | (i,j) for i = -2,0,2,4,6 and j = -6,-4,-2,0,2,4,6 |
| (-4,-6) | (i,j) for i = -6,-4,-2,0,2 and j = -6,-4,-2,0 | ( 4,-2) | (i,j) for i = -2,0,2,4,6 and j = -6,-4,-2,0,2,4 |
| (-2, 6) | (i,j) for i = -6,-4,-2,0,2,4 and j = 0,2,4,6 | ( 4,-4) | (i,j) for i = -2,0,2,4,6 and j = -6,-4,-2,0,2 |
| (-2, 4) | (i,j) for i = -6,-4,-2,0,2,4 and j = -2,0,2,4,6 | ( 4,-6) | (i,j) for i = -2,0,2,4,6 and j = -6,-4,-2,0 |
| (-2, 2) | (i,j) for i = -6,-4,-2,0,2,4 and j = -4,-2,0,2,4,6 | ( 6, 6) | (i,j) for i = 0,2,4,6 and j = 0,2,4,6 |
| (-2, 0) | (i,j) for i = -6,-4,-2,0,2,4 and j = -6,-4,-2,0,2,4,6 | ( 6, 4) | (i,j) for i = 0,2,4,6 and j = -2,0,2,4,6 |
| (-2,-2) | (i,j) for i = -6,-4,-2,0,2,4 and j = -6,-4,-2,0,2,4 | ( 6, 2) | (i,j) for i = 0,2,4,6 and j = -4,-2,0,2,4,6 |
| (-2,-4) | (i,j) for i = -6,-4,-2,0,2,4 and j = -6,-4,-2,0,2 | ( 6, 0) | (i,j) for i = 0,2,4,6 and j = -6,-4,-2,0,2,4,6 |
| (-2,-6) | (i,j) for i = -6,-4,-2,0,2,4 and j = -6,-4,-2,0 | ( 6,-2) | (i,j) for i = 0,2,4,6 and j = -6,-4,-2,0,2,4 |
| ( 0, 6) | (i,j) for i = -6,-4,-2,0,2,4,6 and j = 0,2,4,6 | ( 6,-4) | (i,j) for i = 0,2,4,6 and j = -6,-4,-2,0,2 |
| ( 0, 4) | (i,j) for i = -6,-4,-2,0,2,4,6 and j = -2,0,2,4,6 | ( 6,-6) | (i,j) for i = 0,2,4,6 and j = -6,-4,-2,0 |
| ( 0, 2) | (i,j) for i = -6,-4,-2,0,2,4,6 and j = -4,-2,0,2,4,6 | | |
| ( 0, 0) | (i,j) for i = -6,-4,-2,0,2,4,6 and j = -6,-4,-2,0,2,4,6 | | |
| ( 0,-2) | (i,j) for i = -6,-4,-2,0,2,4,6 and j = -6,-4,-2,0,2,4 | | |

FIG. 4

METHOD AND APPARATUS OF JOINT ADAPTIVE CHANNEL ENCODING, ADAPTIVE SYSTEM FILTERING, AND MAXIMUM LIKELIHOOD SEQUENCE ESTIMATION PROCESS BY MEANS OF AN UNKNOWN DATA TRAINING

BACKGROUND—FIELD OF INVENTION

The present invention relates in general to an adaptive receiver for use in a digital communication system using a quadrature amplitude modulation (QAM) technique. More particularly, this invention relates to a method and apparatus whereby a joint operation of an adaptive channel encoding process, an adaptive system filtering process and a process of maximum likelihood sequence estimation (MLSE), by means of a system-characteristics oriented error estimation criterion underlying the present invention, is realized with an unknown data training.

The term QAM is used here in its broadest sense such that said QAM technique includes, in particular, a pulse amplitude modulation (PAM) and a phase-shift keying (PSK) modulation as well as a QAM in its narrow sense that it involves an independent modulation of two quadrature carriers.

BACKGROUND—DESCRIPTION OF PRIOR ART

Said adaptive receiver used in said digital communication system determines the quality and complexity of an information exchange process via a transmission channel. Meanwhile, said adaptive receiver sets the requirements, limitations, and restrictions on said transmission channel. For example, an encoding/decoding process is conventionally used to improve the performance of a communication system. Such a system performance is usually evaluated with regard to a minimized error probability. The basic requirement for the application of said encoding/decoding process is that the characteristics of said communication system is under control. In practice, the characteristics of said transmission channel is usually unknown.

To avoid confusion, a distinguish is made between said transmission channel and said communication system that the latter is a concatenation of the former and a receiving device.

In order to combat intersymbol interference (ISI) of said communication system, an adaptive receiving filter has been commonly applied; in the prior art, however, there has been no direct concern of how to learn and control the characteristics of said communication system.

In prior art, an error criterion of signal estimation type is conventionally adopted for the operation of said adaptive receiving filter. It is defined by the difference between a reliable signal reference and an estimated signal. One of the examples of said error criterion of signal estimation type is a mean-square error (MSE). Said MSE measures a magnitude of squared difference between a desired signal sequence $\{I_k\}$ and an output signal sequence $\{\hat{I}_k\}$ from said adaptive receiving filter that $$\epsilon_{MSE}=E\{|I_k-\hat{I}_k|^2\}. \quad (1)$$

The notation $E\{.\}$ stands for a statistical expectation wherein said desired signal sequence $\{I_k\}$ and said output signal sequence $\{\hat{I}_k\}$ are both considered to be random. The measured MSE is then fedback to said adaptive receiving filter. Adjustments of said adaptive receiving filter are made in the direction of minimizing said MSE to be measured for the subsequent instants.

A preamble data training and testing process by using a known data sequence is necessary for the operation of said adaptive receiving filter wherein said error criterion of signal estimation type is applied. Several methods of training said adaptive receiving filter with a known data sequence have been reviewed in U.S. Pat. No. 4,227,152 to Godard et al. (1980). More examples for the application of said error criterion of signal estimation type for the operation of said adaptive receiving filter can be found in U.S. Pat. No. 5,119,400 to Koch (1992), U.S. Pat. No. 5,117,291 to Fadavi-Ardekani et al. (1992), U.S. Pat. No. 5,113,441 to Yoshida et al. (1992), and U.S. Pat. No. 4,789,952 to Lo et at. (1988), where the requirement of using a known data sequence as said reliable signal reference prior to a normal data transmission is verbally stated. In U.S. Pat. No. 4,599,732 to LeFever (1986), known data sequences are interleaved with unknown data messages to achieve a timing and frequency synchronization for an adaptive communication receiver wherein said adaptive receiving filter is employed.

The requirement and implementation of said preamble data training and testing process set restrictions on practical communications. For example, it excludes many applications in high-rate data transmissions wherein the characteristics of said transmission channel changes very fast. In these cases, said preamble data training and testing process is necessary for the operation of said adaptive receiving filter, but the timing of an aperiodic data training is out of control whereby channel encoding achievements are degraded due to the unknown and distorted characteristics of said transmission channel. On the other hand, a process of periodic data training takes a lot of transmission overhead that sacrifices rate of information exchange and increases transmission cost.

The operation of said adaptive receiving filter implemented by means of an unknown data training has been investigated and proposed—for example, in U.S. Pat. No. 4,227,152 to Godard et al. (1980), and other technical references such as the articles entitled "A Method of Self-Recovering Equalization for Multilevel Amplitude Modulation Systems," authored by Y. Sato, IEEE Transactions on Communications, vol. COM-23, No. 6, June 1975, pp.679–682, "Self Recovering Equalization and Carrier Tracking in Two Dimensional Data Communication Systems," authored by D. N. Godard, IEEE Transactions on Communications, vol. COM-28, No. 11, November 1980, pp.1867–1875, "Approaches to Blind Equalization of Signals with Multiple Modulus," authored by W. A. Sethares et at., Proceedings of the IEEE International Conference on Acoustics, Speech, and Signal Processing, vol. 2, 1989, pp.972–975, "Blind Equalization with Criterion with Memory Nonlinearity," authored by Y. Chen et al., Optical Engineering, vol. 31, No. 6, June 1992, pp.1200–1210 and "Channel Estimation Standard and Adaptive Blind Equalization," authored by Yuang Lou, Proceedings of the IEEE International Symposium on Circuits and Systems, San Diego, Calif., U.S.A., May 1992, vol. 2, pp.505–508. These proposed devices and processes-of said adaptive receiving filter are commonly referred to as adaptive blind equalizers and adaptive blind equalization processes, respectively, where the requirement of said preamble data training and testing process using a known data sequence is removed. Instead of using said error criterion of signal estimation type, some of these proposed adaptive blind equalizers adopt an error criterion of statistical estimation type for an error measurement between said desired signal sequence $\{I_k\}$ and said output signal sequence $\{\hat{I}_k\}$ from said adaptive receiving filter; for example, in the articles entitled "A Method of Self-Recovering Equalization for Multilevel Amplitude Modulation Systems," authored by Y. Sato, IEEE Transactions on Communications, vol. COM-23, No. 6, June 1975, pp.679–682, "Self Recovering Equalization and Carrier Tracking in Two Dimensional Data Communication Systems," authored by D. N. Godard, IEEE Transactions on Communications, vol. COM-28, No. 11, November 1980, pp.1867–1875, "Approaches to Blind Equalization of Signals with Multiple Modulus," authored by W. A. Sethares et al., Proceedings of the IEEE International Conference on Acoustics, Speech, and Signal Processing, vol. 2, 1989, pp.972–975, and "Blind Equalization with Criterion with Memory Nonlinearity," authored by Y. Chen et al., Optical Engineering, vol. 31, No. 6, June 1992, pp.1200–1210.

The main drawbacks of using said error criterion of statistical estimation type for the operation of said adaptive receiving filter are:

(1) Its convexity and unique global minimum properties are not guaranteed. One of the examples has been investigated in an article entitled "Ill-Convergence of Godard Blind Equalizers in Data Communication Systems," authored by Z. Ding et at., IEEE Transactions on Communications, vol. COM-39, No. 9, September 1991, pp.1317–1327. It should be noted that even though the statistics of said desired signal sequence $\{I_k\}$ and the statistics of said output signal sequence $\{\hat{I}_k\}$ are the same, i.e., an error measurement of statistical estimation type is zero, said output signal sequence $\{\hat{I}_k\}$ is not necessary to be a replica of said desired signal sequence $\{I_k\}$.

(2) The basic requirement for the application of said encoding/decoding process is to get the characteristics of said communication system under control. However, the minimum error measurement of statistical estimation type is not equivalent to the condition that the characteristics of said communication system is under control. Therefore, there is no guarantee for the applicability of said encoding/decoding process when said error measurement of statistical estimation type is minimized.

(3) Said error measurement of statistical estimation type is limited within a non-spectral-null communication environment, such that it is excluded from a spectral-null communication environment.

Besides the technique of adaptive equalization in said adaptive receiver, other techniques have been proposed that can be applied to said communication system with intersymbol interference (ISI). Such receivers are described in the articles entitled "Adaptive Maximum Likelihood Receiver for Carrier-Modulated Data Transmission Systems," authored by G. Ungerboeck, IEEE Transactions on Communications, vol. COM-22, No. 5, May 1974, pp.624–636, and "Maximum Likelihood Sequence Estimation of Digital Sequences in the Presence of Intersymbol Interference," authored by G. D. Forney Jr., IEEE Transactions on Information Theory, vol. IT-18, No. 3, May 1972, pp.363–378. However, in these proposed maximum likelihood sequence estimation (MLSE) receivers, said adaptive receiving filter is required and then operated by said error criterion of signal estimation type and so said preamble data training and testing process for the initial setup of said adaptive receiving filter is indispensable. Even though under said preamble data training and testing process, a channel encoding process, a controlling process of the characteristics of said communication system, and an MLSE process can be implemented simultaneously, each process follows its own merit, wherefore a joint optimization of these processes cannot be reached.

OBJECTS AND ADVANTAGES

Accordingly, the objects and advantages of the present invention are:

(a) to provide a method and apparatus for a reliable adaptive receiver with an unknown data training, which is connected to said transmission channel to form an overall adaptive system, (b) to provide a method and apparatus for said reliable adaptive receiver used in a transmission network without adversely affecting the operation of said transmission network, (c) to provide a method and apparatus for said reliable adaptive receiver whereby said adaptive channel encoding process is induced without increasing the operational complexity of a relevant transmitter, (d) to provide a method and apparatus for said reliable adaptive receiver which can be operated within an adaptive partial response signaling system so that said method and apparatus relaxes the restriction on said reliable adaptive receiver's operation in said spectral-null communication environment, (e) to provide a method and apparatus for said reliable adaptive receiver which automatically adjusts itself to control the characteristics of said overall adaptive system mentioned in (a), (f) to provide a method and apparatus for said reliable adaptive receiver whereby said MLSE process is jointly operated together with said adaptive channel encoding process to enhance controlling of the characteristics of said overall adaptive system, and (g) to provide a method and apparatus for the application of a system identification.

Further objects and advantages will become apparent from the consideration of the ensuing description and drawings.

SUMMARY OF THE INVENTION

Broadly speaking, the present invention provides a method and apparatus for effecting a control over a digital operated system. In particular, said method and apparatus of the present invention can be applied for building up a reliable and flexible adaptive digital communication system whereby an information retrieval can be done by means of an unknown data training. The present invention enlarges the operational class of said information retrieval for there is no need of said preamble data training and testing process by using a known data sequence as is required for the process of an adaptive equalization with a conventional adaptive MLSE process.

The present invention presents a way to track the characteristics of said overall adaptive system for digital communications. Said overall adaptive system is formed by said transmission channel concatenated by said adaptive receiver, which is responsible for said adaptive system filtering process and an adaptive MLSE process. A direct control over the characteristics of said overall adaptive system is realized by minimizing the difference between the characteristics of said overall adaptive system and an ideal system reference for the characteristics of said overall adaptive system which has been specified by a user of the present invention. Said direct control over the characteristics of said overall adaptive system has the merit that it meets the basic requirement for applying said encoding/decoding process. This is not the case when said error criterion of statistical estimation type is used instead. Since an adaptive system filtering device is incorporated in said adaptive receiver, it may also be called an adaptive receiver filter.

The present invention has its advantages over the prior art, wherein said error criterion of statistical estimation type is used, in that said overall adaptive system for digital communications where the present invention is applied behaves as an adaptive channel encoder in a joint operation with said adaptive system filtering device. Moreover, the spectral nulls in the characteristics of an ideal partial response signaling system can be specified by said user at the locations where the spectral nulls of said transmission channel are if any.

In addition, the present invention demonstrates its advantages over the prior art where said error criterion of statistical estimation type is used, in that said overall adaptive system for digital communications can be operated in a fashion that said adaptive system filtering device is implemented jointly with a maximum likelihood sequence estimator (MLSE) whereby a soft decision decoding (SDD) process is carried out. The joint operation of said adaptive channel encoder, said adaptive system filtering device and said MLSE determines an estimate of the transmitted data sequence through said overall adaptive system when the minimum error probability in the detected symbol sequence is reached by means of said direct control of the characteristics of said overall adaptive system.

Said method and apparatus of the present invention can also be applied to said system identification with the aid of said direct control over the characteristics of said overall adaptive system, when a system to be identified replaces said transmission channel in said overall adaptive system.

Although the description of the present invention contains some specificities, these should not be construed as limiting the scope of the present invention but as merely providing illustrations of some of the presently preferred embodiments of this invention. For example, said ideal system reference specified by a user for the characteristics of said overall adaptive system can be in a general partial response signaling format in time domain; the length N specification of an ideal discrete partial response signaling impulse response can be extended to any $N > 0$; said direct control over the characteristics of said overall adaptive system can be implemented in other forms, such as an error control is operated in frequency domain or time-frequency domain, etc.; said reliable and flexible adaptive system described in the present invention can be adapted for use in an adaptive system control or an adaptive system identification, etc.

Thus the scope of the present invention should be determined by the appended claims and their legal equivalents, rather than by the examples given.

DRAWING FIGURES

In the drawings, closely related figures have the same numerals but different alphabetic suffixes.

FIG. 4 shows the state transition subsets of said signal point constellation given in FIG. 2B. The selection of the kth state subset is subject to the (k−1)th state.

REFERENCE NUMERALS IN DRAWINGS

Figure 1:
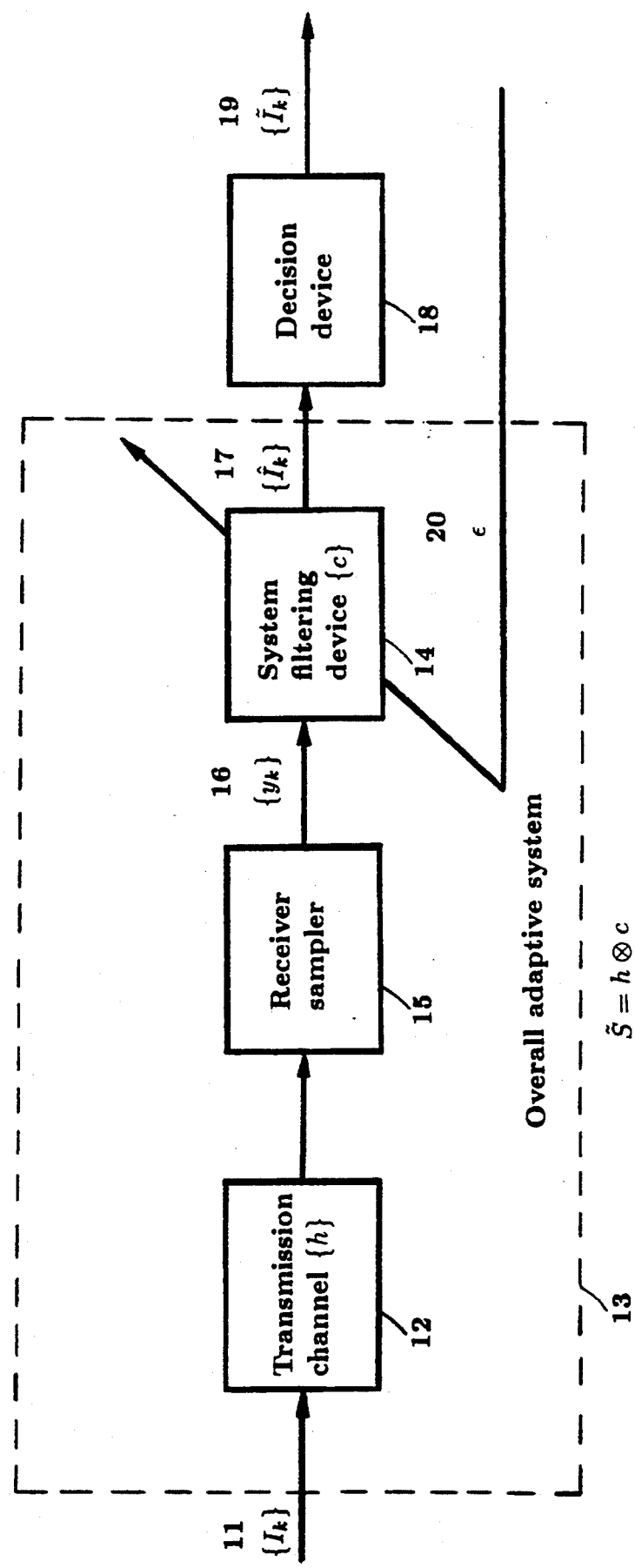
FIG. 1 shows a simplified block diagram of said overall adaptive system for communications. The section of a receiver sampler and a system filtering device represents the embodiments of the present invention.

11 input port of said transmission channel
12 said transmission channel h whose characteristics is dynamic and unknown
13 said overall adaptive system which can be modelled as said adaptive channel encoder whereby the characteristics of said overall adaptive system is shaped into a partial response signaling format
14 said adaptive system filtering device which shapes the characteristics of said overall adaptive system
15 said receiver sampler which samples a received signal from said transmission channel h
16 a sampled sequence of said received signal
17 a signal sequence of output signal from said system filtering device
18 a decision device with limiting thresholds
19 a detected symbol sequence from said decision device
20 error measured and fedback to said adaptive system filtering device
21 decision threshold grid for use in the minimum Euclidean distance rule
22 an Euclidean distance measurement
23 input port of a transmitter encoder
24 a signal mapping device
25 an output symbol sequence from said signal mapping device
26 a precoding device
27 an MLSE processor
28 an output symbol sequence of said MLSE processor
29 a decoding device 30 an output symbol sequence of said decoding device 31 an inverse signal mapping device 32 a recovered symbol sequence at the final stage 33 said transmitter encoder 34 an MLSE receiver-decoder 35 average error rate versus signal-to-noise ratio (SNR) for an adaptive blind equalization process using a class I partial response signaling format, where a symbol-by-symbol decision has been made according to the minimum Euclidean distance rule 36 average error rate versus signal-to-noise ratio (SNR) for a joint operation of said adaptive channel encoder and said MLSE processor using said class I partial response signaling format by means of an unknown data training 40 an adaptive sampling device 41 output port A of said adaptive sampling device 42 output port B of said adaptive sampling device 43 a division device whereby its output is equal to its input divided by a constant divisor $\beta T$ 44 an adaptive timing adjustment device whereby an adaptive compensation of sampling timing error at the k+1th moment is carried out based on its input and the sampling timing error at the kth moment 45 a differentiator for said joint adaptive timing recovery loop whereby calculation of is done and the result is output to the next stage 46 time derivative of output signal $y_k(\Delta \tau)$, i.e., $\dot{y}_k(\Delta \tau)$ 47 time derivative of an output signal $\hat{I}_k$ from said system filtering device, i.e., $\dot{I}_k$

DETAILED DESCRIPTION OF THE PREFERRED EMBODIMENTS

Figure 5:
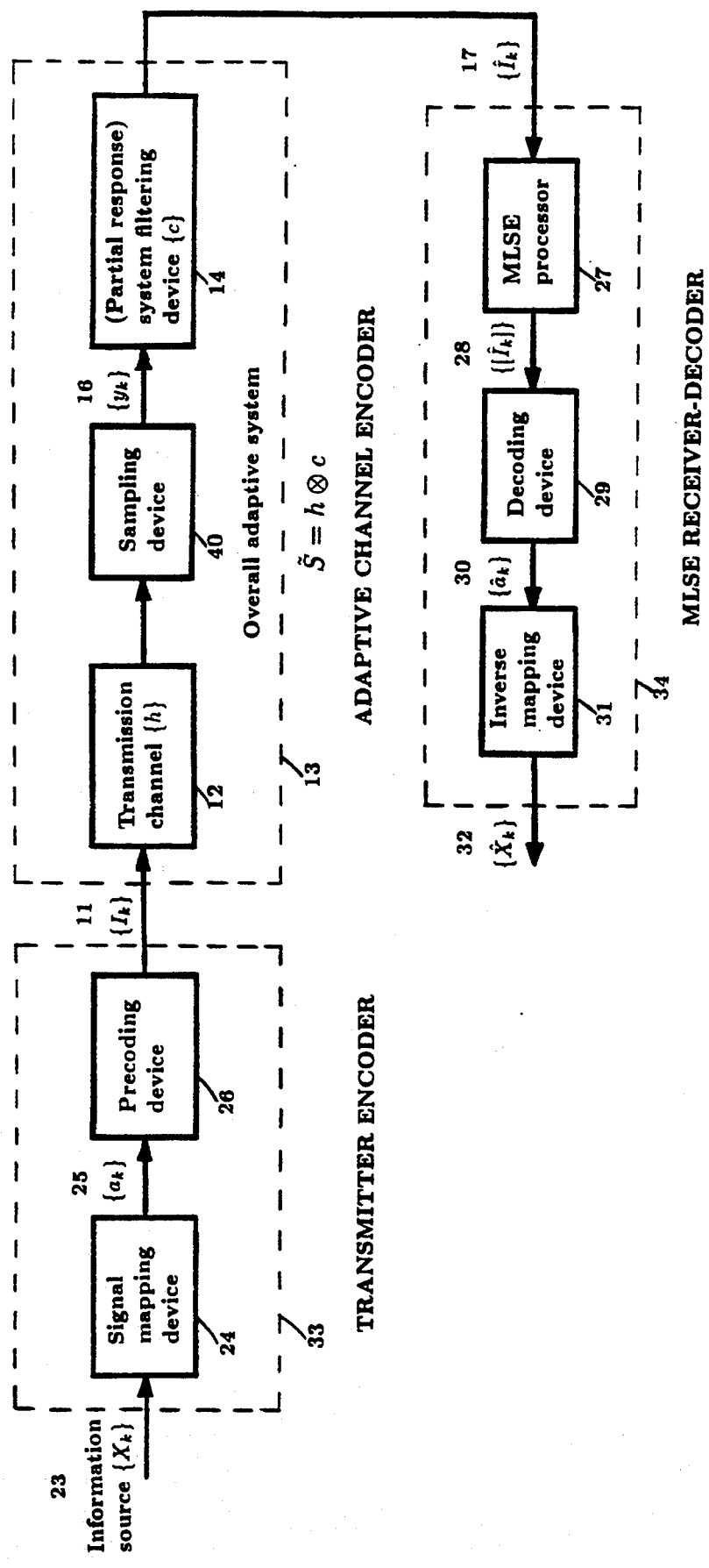
FIG. 5 shows a simplified block diagram for a joint operation of said adaptive channel encoder, said adaptive system filtering device, and said maximum likelihood sequence estimator (MLSE), which is described in the second part of the embodiments of the present invention.

In order to make the present invention dear and easy to understand, a simplified diagram of transmission channel h 12 and adaptive system filtering device c 14 of the present invention is shown in FIG. 1. As the first part of the preferred embodiments, said direct control of the characteristics of said overall adaptive system performed by adaptive system filtering device c 14 when an ideal system reference in $\epsilon$ 20 is chosen is presented. In addition, an implementation example I is given. Then, a detailed description of the joint operation of said adaptive channel encoder, said adaptive system filtering device and said maximum likelihood sequence estimator by means of an unknown data training will be presented in the second part of the preferred embodiments as shown in FIG. 5. Preferred embodiments of the present invention will be illustrated in a baseband model. Corresponding modulation and demodulation devices will not be shown in view of the understanding in the stated art.

In FIG. 1, $\{I_k\}$ at 11 stands for a transmitted data sequence to transmission channel h 12 where the subscript k denotes a time index of a sampled signal sequence. Overall adaptive system S 13 comprises transmission channel h 12, receiver sampler 15 and adaptive system filtering device c 14. In the broadest sense, $\times$ is defined as a mathematical operation. In particular, the operation $\times$ is a convolution of the characteristics of transmission channel h 12 and adaptive system filtering device c 14. Samples $\{h_m\}$ of an impulse response of transmission channel h 12 are unknown. Adaptive system filtering device c 14 has an adaptive coefficient set $\{c_m\}$. Under the operation $\times$ between the characteristics of transmission channel h 12 and adaptive system filtering device c 14, the characteristics of overall adaptive system S 13 is $\{S(m)\} = \{h_m\} \times \{c_m\}$. In general, overall adaptive system S 13 is operated as an adaptive convolutional channel encoder whereby the characteristics of overall adaptive system S 13 is adaptively shaped into a partial response signaling format. Receiver sampler 15 generates a sampled signal sequence $\{y_k\}$ 16 at the input port of adaptive system filtering device c 14. Adaptive system filtering device c 14 is followed by a decision device 18 whereby output signal $\{\hat{I}_k\}$ 17 of adaptive system filtering device c 14 is sliced and a decision symbol $\{I_k\}$ 19 is made. Samples $\{h_m\}$ of said impulse response of transmission channel h 12, said adaptive coefficient set $\{c_m\}$ of adaptive system filtering device c 14, and the signal sequences $\{I_k\}$ at 11, $\{y_k\}$ 16, $\{\hat{I}_k\}$ 17, and $\{I_k\}$ 19 are all considered to be complex. Adaptive system filtering device c 14 is automatically adjusted by a pre-defined error $\epsilon$ 20. The first part of the preferred embodiments relates to the definition of pre-defined error $\epsilon$ 20 and the design of adaptive system filtering device c 14. The operation of adaptive system filtering device c 14 aims at getting said direct control of the characteristics of overall adaptive system S 13 such that in general overall adaptive system S 13 is an adaptive and well controlled partial response signaling system.

The error estimation criterion for $\epsilon$ 20 of the present invention is defined as $$\epsilon = E\left\{ \alpha \sum_{m=0}^{N-1} |S(m) - S_k(m)|^2 + (1-\alpha)|Z(I_k) - \hat{I}_k|^2 \right\}. \quad (2)$$

In Equation (2), $\{S(m)\}$ denotes a set of the sampled characteristics of an ideal complex partial response signaling system which can be specified by a user in a particular application. A complex valued set $\{S_k(m)\}$ stands for the kth estimate of the characteristics of overall adaptive system S 13 since the characteristics of transmission channel h 12 is unknown. The notation $|.|$ stands for the magnitude of a complex signal, and the integer N is the maximum number of samples such that $S(m)=0$ for all $m \geq N$. $Z(I_k)$ is a designed function of $I_k$ 19, and $\hat{I}_k$ 17 is the output signal from adaptive system filtering device c 14. There are two error measurements $\epsilon_1$ and $\epsilon_2$ in Equation (2). The first term of error $\epsilon$ 20, $$\epsilon_1 = E\left\{ \sum_{m=0}^{N-1} |S(m) - S_k(m)|^2 \right\}, \quad (3)$$

represents an error measurement of the difference between the characteristics of said ideal complex partial response signaling system and an estimate of the characteristics of overall adaptive system S 13. The convergence and minimization of the error measurement $\epsilon_1$ in Equation (3) implies said direct control of the characteristics of overall adaptive system S 13. The minimization of the second error measurement in $\epsilon$ 20, $$\epsilon_2 = E\{|Z(I_k) - \hat{I}_k|^2\}, \quad (4)$$

improves the convergence property of error $\epsilon$ 20 when an adaptive control is realized in an Euclidean space. Said adaptive control in said Euclidean space is represented by a minimized Euclidean distance 22 measured between $\{I_k\}$ and $\{\hat{I}_k\}$ shown in FIG. 2A. Further considerations and explanations about the design of a function $Z\{I_k\}$ are illustrated in a subsequent example. In Equation (2), a parameter $\alpha$ is used as a combination factor which takes a real value in the range of (0, 1]. Said parameter $\alpha$ weights the two error measurements $\epsilon_1$ and $\epsilon_2$ in error $\epsilon$ 20.

An adaptive algorithm is invoked to minimize error $\epsilon$ 20 in order to gain said direct control of the characteristics of overall adaptive system S 13.

The concept and design of the estimation criterion for error $\epsilon$ 20 are totally different from that employed in the prior art. For example, said MSE given in Equation (1) is defined by the difference between said desired signal sequence $\{I_k\}$ and said output signal sequence $\{\hat{I}_k\}$ of said adaptive system filtering device. An effective operation of said adaptive system filtering device following said MSE is limited to the availability of said desired signal sequence $\{I_k\}$ which is a reliable signal reference for the output signal sequence $\{\hat{I}_k\}$; otherwise, said adaptive system filtering device loses control of the characteristics of overall adaptive system S 13. In the prior art using said error criterion of statistical estimation type, said direct control of the characteristics of said overall adaptive system has never been realized. Therefore, the basic requirement for the application of said encoding/decoding process to achieve a reliable and flexible communication system that the characteristics of said reliable and flexible communication system should be under control is not satisfied in the prior art using said error criterion of statistical estimation type.

For the purpose of illustration, we are going to exemplify one of the designs and implementations of error $\epsilon$ 20 under the following conditions and definitions which are conventionally accepted. Further modifications and extensions to other applications are not limited by the examples given, and the scope of the present invention is determined by the appended claims and their legal equivalents.

Figure 2A:
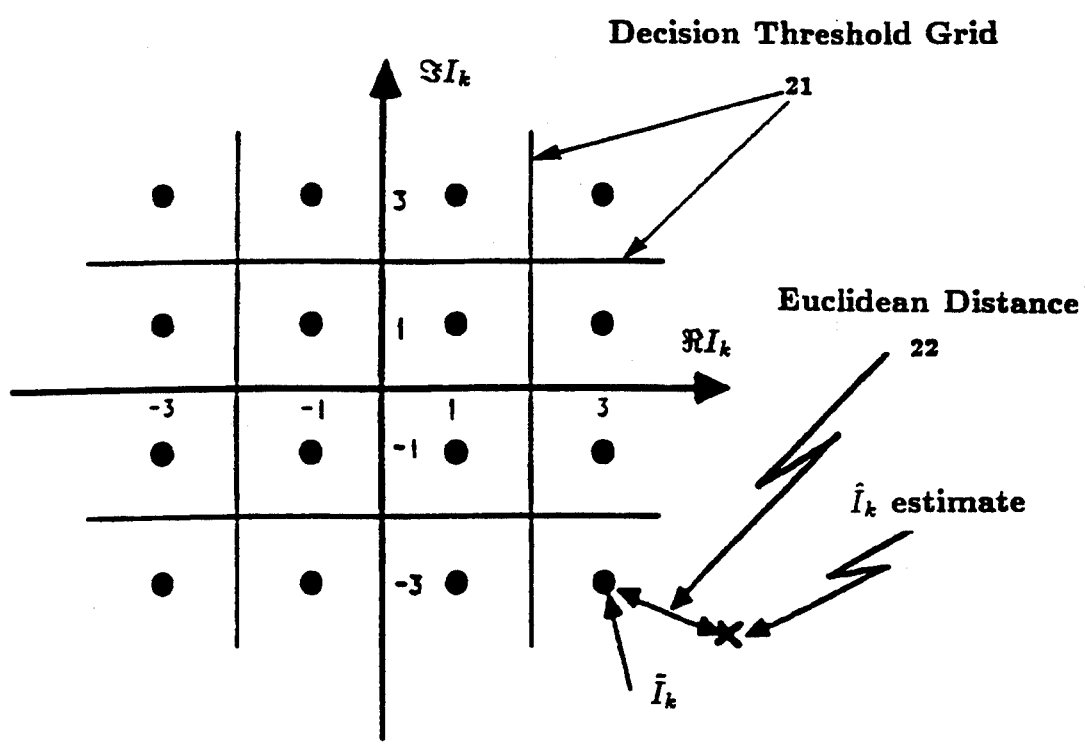
FIG. 2A shows a 16-point QAM signal constellation, and its decision thresholds for an estimated signal point $\hat{I}_k$ in the sense of a minimum Euclidean distance measurement.

(1) Transmitted data sequence $\{I_k\}$ at input port 11 of said transmission channel h belongs to a QAM signal constellation. One of the examples of said QAM signal constellation is shown in FIG. 2A. Transmitted data sequence $\{I_k\}$ at input port 11 of said transmission channel h is ergodic with the following statistical properties $$E\{I_k\} = 0 \qquad (5)$$

and $$E\{I_k I^*_{k'}\} = \delta_{k,k'}. \qquad (6)$$

As appreciated by those skilled in the art, said statistical properties of transmitted data sequence $\{I_k\}$ can be realized by means of a data scrambling. Superscript * represents a complex conjugate, stands for the average energy of said transmitted data sequence $\{I_k\}$, and $\delta_{k,k'}$ denotes the Kronecker delta function with $$\delta_{k,k'} = \begin{cases} 1, & k = k'; \\ 0, & k \neq k'. \end{cases} \qquad (7)$$

(2) Samples $\{n_k\}$ of a noise process in transmission channel h 12 are of an additive white gaussian distribution with zero mean and variance $\sigma_n^2$. The samples $\{n_k\}$ of said noise process is independent of said transmitted data sequence $\{I_k\}$ at input port 11 of said transmission channel h such that $$\begin{aligned} E\{I_k^* n_k\} &= E\{I_k^*\} E\{n_k\} \qquad (8) \\ &= 0. \end{aligned}$$

(3) The characteristics of transmission channel h 12 is linearly modelled, and said sampled sequence of received signal $\{y_k\}$ 16 are elements of a random process.

(4) A time updated average at the kth iteration is defined as $$<\cdot>_k = \frac{1}{k+1} \sum_{i=0}^{k} \{\cdot i\} \qquad (9)$$

for $k < N_{ob}$. $N_{ob}$ is a selected time length of a finite observation window. When $k \geq N_{ob}$, said time updated average with a sliding window is defined as $$<\cdot>_k = <\cdot>_{k-1} + \frac{\{\cdot k\} - \{\cdot k - N_{ob}\}}{N_{ob}}. \qquad (10)$$

Thus, the result of said time updated average is still random.

(5) With respect to a selected length $2L+1$ of adaptive system filtering device c 14, the vector $Y_k$ of said sampled sequence of received signal $\{y_k\}$ 16 at the kth iteration and the vector of coefficients $\{c_m\}$ of adaptive system filtering device c 14 are defined as $$Y_k = (y_{k+L}, \ldots, y_k, y_{k-1}, \ldots, y_{k-L})^T \qquad (11)$$

and $$C = (c_{-L} \ldots c_0, \ldots, c_L)^T. \qquad (12)$$

Superscript $T$ stands for a vector/matrix transposition.

Now in Equation (2), said complex valued set $\{\hat{I}_k(m)\}$ at the kth iteration is defined and calculated as $$S_k(m) = \frac{<I^*_{k-m} I_k>_k}{} \qquad (13)$$

for $m = 0, 1, \ldots, N-1$. In Equation (13), $I^*_{k-m}$ is the complex conjugate of an element of detected symbol sequence $\{I_k\}$ 19.

In Equation (2), said signal sequence $\{\hat{I}_k\}$ output from said adaptive system filtering device is $$\begin{aligned} \hat{I}_k &= Y_k^T C \qquad (14) \\ &= \sum_{l=-L}^{L} y_{k-l} c_l. \end{aligned}$$

In Equation (2), said function $Z(I_k)$ is defined as $$Z(I_k) = I_k - \frac{(1-\alpha) \sum_{l=-L}^{L} \sum_{m=0}^{N-1} (S(m) - S_k(m)) u^*_{l,m}}{\alpha \sum_{l=-L}^{L} y^*_{k-l}} \qquad (15)$$

when a term $\Sigma_{l=-L}^{L} y^*_{k-l} \neq 0$. If said term $\Sigma_{l=-L}^{L} y^*_{k-l} = 0$, the calculation of said function $Z(I_k)$ is switched to $$Z(I_k) = I_k - \frac{(1-\alpha) \sum_{l=-L}^{L} \sum_{m=0}^{N-1} (S(m) - S_k(m)) u^*_{l,m} y_{k-l}}{\alpha \sum_{l=-L}^{L} |y_{k-l}|^2}. \quad (16)$$

In Equations (15) and (16), the quantity $u^*_{l,m}$ is defined and estimated as $$u^*_{l,m} = \frac{<y^*_{k-l} I_{k-m}>_k}{}. \quad (17)$$

An adaptive algorithm for adaptive system filtering device c 14 is then invoked to minimize error $\epsilon$ 20 defined in Equation (2). An implementation example I of adaptive system filtering device c 14 for the first part of the preferred embodiments is now in position.

IMPLEMENTATION EXAMPLE I

The implementation of adjusting adaptive system filtering device c 14 comprises the following steps:

(1) Basing on the signal constellation knowledge of transmitted data sequence $\{I_k\}$ at 11, we set up decision threshold grid 21 for a minimum Euclidean distance rule. One of the design examples of decision threshold grid for a 16-point QAM signal transmission scenario is given in FIG. 2A. In this example, we select said parameter $\alpha = \frac{1}{2}$ in Equation (2) for an equal weight between the $\epsilon_1$ and $\epsilon_2$ error measurements. Parameter N is chosen to be unity so that $S(0) = 1$ and $S(m) = 0$ for all $m \neq 0$ are selected for an ideal delta impulse response of overall adaptive system S 13. Total number $2L+1$ of coefficients $\{c_m\}$ in adaptive system filtering device c 14 is pre-determined, e.g., $2L+1 = 21$. A real valued testing threshold $\Delta$ for said term $\Sigma_{l=-L}^{L} y^*_{k-l}$ is initially set up, e.g., $\Delta = 0.00001$. In this example, we demonstrate a least-mean square (LMS) adaptive process for the case that parameter $\mu$ for step size is pre-selected, e.g. $\mu = 0.0002$. Since the performance of adaptive system filtering device c 14 aims at minimizing error $\epsilon$ 20, said LMS adaptive process can be substituted by other adaptive processes as long as they can reach the goal of using said adaptive system filtering device. For example, instead of using said LMS adaptive process, a recursive least-squares (RLS) adaptive process can be invoked for a faster convergence rate with a higher computational cost. The iterative procedure of said LMS adaptive process by adaptive system filtering device c 14 is then demonstrated step by step as follows.

(2) Said signal sequence $\{\tilde{I}_k\}$ of adaptive system filtering device c 14 is calculated by Equation (14). Then a symbol decision $\{I_k\}$ is made by the application of said minimum Euclidean distance rule to $\{\tilde{I}_k\}$. An estimate of the characteristics of overall adaptive system S 13 is carried out by Equation (13).

(3) Said term $\Sigma_{l=-L}^{L} y^*_{k-l}$ is always monitored during the process performed by adaptive system filtering device c 14. Whenever $$\left| \sum_{l=-L}^{L} y^*_{k-l} \right| > \Delta, \quad (18)$$

said function $Z(I_k)$ is calculated by Equation (15). If the condition of Equation (18) is not satisfied, the calculation of said function $Z(I_k)$ is carried out by Equation (16). Thus, the convergence of a process performed by adaptive system filtering device c 14 is fast and stable without increasing a computational cost. The switching policy as such is described and tested in an article entitled "Comparison of Adaptive Blind Equalizers", authored by Yuang Lou, Proceedings of the IEEE International Conference on Acoustics, Speech, and Signal Processing, San Francisco, U.S.A., March 1992, vol. IV, pp.545-548.

(4) The gradient of $\epsilon$ 20 with respect to the coefficients $\{c_m\}$ of adaptive system filtering device c 14 is then carried out that $$\left( \frac{\partial}{\partial c_n} + j \frac{\partial}{\partial \tau c_n} \right) \epsilon = \quad (19)$$

$$-4(1-\alpha) E \left\{ \sum_{m=0}^{N-1} (S(m) - S_k(m)) u^*_{n,m} \right\} +$$

$$4\alpha E \left\{ \left( \frac{(1-\alpha) \sum_{m=0}^{N-1} \sum_{l=-L}^{L} u^*_{n,m} u_{l,m}}{\alpha \sum_{l=-L}^{L} y_{k-l}} - y^*_{k-n} \right) (Z(I_k) - I_k) \right\}$$

for all $n = -L, \ldots, 0, \ldots, L$. In Equation (19), the notations and stand for the real and imaginary components of a complex quantity, and $j = \sqrt{-1}$. When said term $\Sigma_{l=-L}^{L} y_{k-l}$ satisfies Equation (18), said function $Z(I_k)$ in Equation (19) is substituted by the expression given in Equation (15). If the condition of Equation (18) is not met, the gradient calculation of Equation (19) is switched to $$\left( \frac{\partial}{\partial c_n} + j \frac{\partial}{\partial \tau c_n} \right) \epsilon = \quad (20)$$

$$-4(1-\alpha) E \left\{ \sum_{m=0}^{N-1} (S(m) - S_k(m)) u^*_{n,m} \right\} +$$

$$4\alpha E \left\{ \left( \frac{(1-\alpha) \sum_{m=0}^{N-1} \sum_{l=-L}^{L} u^*_{n,m} u_{l,m} y^*_{k-l}}{\alpha \sum_{l=-L}^{L} |y_{k-l}|^2} - y^*_{k-n} \right) (Z(I_k) - I_k) \right\}$$

for all $n = -L, \ldots, 0, \ldots, L$. Said function $Z(I_k)$ in Equation (20) is then substituted by the expression given in Equation (16).

In said LMS adaptive process, said statistical expectation $E\{.\}$ is simply dropped off, and the coefficients $\{c_m\}$ of adaptive system filtering device c 14 is updated iteratively by the following formula $$c_n = c_n - \frac{\mu}{2} \left( \frac{\partial}{\partial c_n} + j \frac{\partial}{\partial \tau c_n} \right) \epsilon \quad (21)$$

for all $n = -L, \ldots, 0, \ldots, L$. The selection of the expression for the gradient terms in Equation (21) is determined by the result of monitoring Equation (18). When Equation (18) is satisfied, Equation (19) will be substituted into Equation (21). When Equation (18) is not satisfied, the gradiant of $\epsilon$ 20 with respect to $\{c_m\}$ in Equation (21) will be given by Equation (20).

Technical features in implementation example I are stated as follows.

In implementation example I, the characteristics of transmission channel h 12 can be adaptively identified. When the characteristics of said overall adaptive system is under control, i.e., the measured error defined in Equation (2) is being minimized, the estimate of the characteristics of transmission channel h 12 is adaptively converging to an ideal system reference for the characteristics of overall adaptive system S 13 divided by the characteristics of adaptive system filtering device 14.

In implementation example I, receiver sampler 15 is operated at the same rate as that of said transmitted data sequence $\{I_k\}$. This is called a symbol rate operation. Receiver sampler 15 can also be operated at a higher sampling rate than that of said symbol rate operation. An adaptive filtering technique using said higher sampling rate is called a fractional-spaced adaptive filtering technique.

Figure 3:
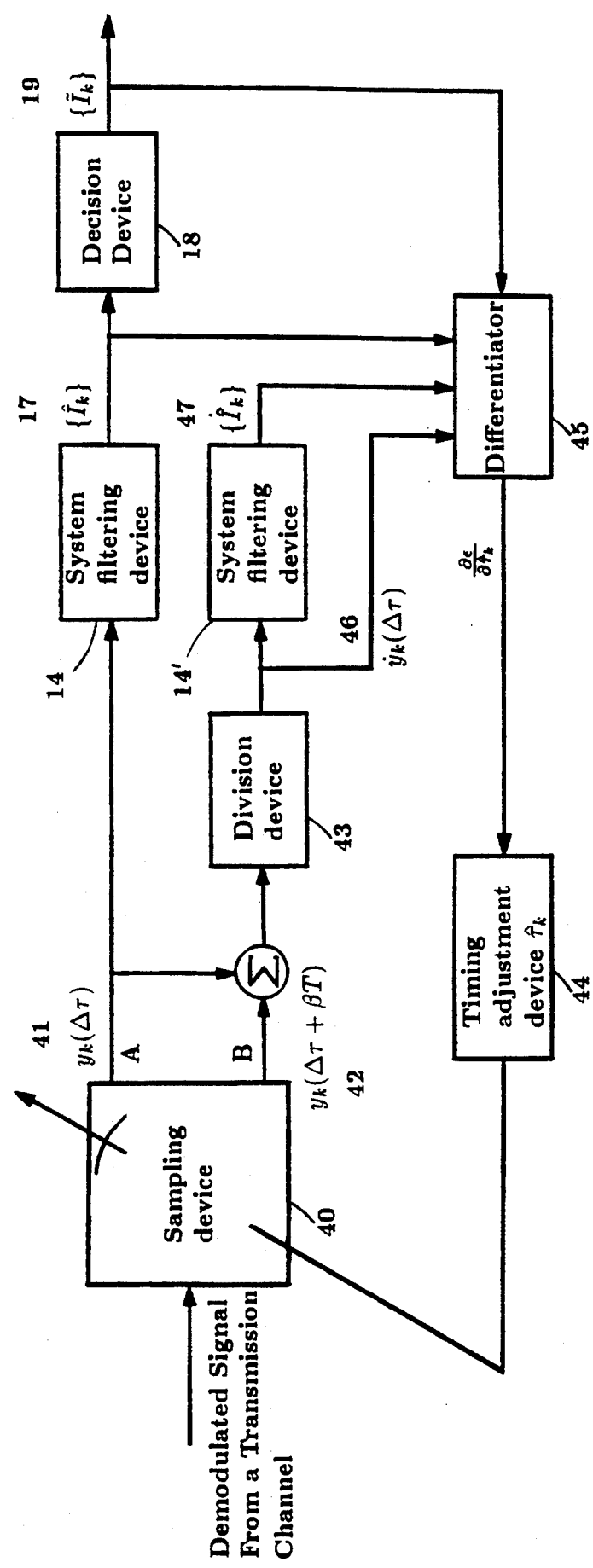
FIG. 3 shows a joint adaptive timing recovery loop incorporated with said adaptive system filtering device.

In said implementation example I, receiver sampler 15 is operated independently of adaptive system filtering device c 14. In order to achieve a joint optimization of sampling and filtering, receiver sampler 15 in FIG. 1 is replaced by an adaptive sampling device 40 in FIG. 3 which is used in said joint adaptive timing recovery loop incorporated with adaptive system filtering device c 14. An adaptive timing adjustment device 44 is used to adjust the timing phase of adaptive sampling device 40. Demodulated signal from transmission channel h 12 is the input of adaptive sampling device 40. There are two output ports of adaptive sampling device 40, i.e., port A 41 and port B 42. Sampling timing difference between port A 41 and port B 42 is $\beta T$. Here, $\beta$ is a real parameter in the value range (0,1) and T is the time interval between adjacent symbols in said transmitted data sequence $\{I_k\}$. In said joint adaptive timing recovery loop, there are two identical adaptive system filtering devices sharing the same set of coefficients $\{c_m\}$ but taking different input signal sequences from port A 41 and a signal sequence $\{y_k(\Delta\tau)\}$ 46, respectively.

Signal sequence $\{y_k(\Delta\tau)\}$ 46 is the output signal sequence of a division device 43 which is the approximate time derivative of $\{y_k(\Delta\tau)\}$ from port A 41 such that $$y_k(\Delta\tau) = \frac{y_k(\Delta\tau + \beta T) - y_k(\Delta\tau)}{\beta T} \tag{22}$$

In Equation (22), notation $\Delta\tau$ stands for an unknown sampling timing error. An adaptive compensation for said unknown sampling timing error is carried out by adaptive timing adjustment device 44 such that $$\tau_{k+1} = \tau_k - \mu_\tau \frac{\partial \epsilon}{\partial \tau} \tag{23}$$

is fedback to adjust the timing of adaptive sampling device 40. In Equation (23), step size $\mu_\tau$ is a pre-selected parameter, e.g. $\mu_\tau = 10^{-3}$. The quantity of Equation (23) is calculated in a differentiator 45 that $$\frac{\partial \epsilon}{\partial \tau} = -2\alpha E\left\{\left(\sum_{m=0}^{N-1}(S(m) - S_k(m))\frac{<I_{k-m}I_k>_k}{}\right)\right\} + 2(1-\alpha)E\{[Z_k^* - I_k^*][Z_k - I_k]\}\}. \tag{24}$$

Equation (24), time derivative $\{I_k\}$ 47 is obtained that $$I_k = \sum_{l=-L}^{L} y_{k-l}(\Delta\tau)c_l \tag{25}$$

and $$Z_k = \frac{(1-\alpha)\sum_{l=-L}^{L}\sum_{m=0}^{N-1}<I^*_{k-m}I_k>_k u^*_{l,m}}{\alpha \sum_{l=-L}^{L} y^*_{k-l}(\Delta\tau)} - \tag{26}$$

$$\frac{(1-\alpha)\sum_{l=-L}^{L}\sum_{m=0}^{N-1}(S(m)-S_k(m))<I_{k-m}y^*_{k-l}(\Delta\tau)>_k}{\alpha \sum_{l=-L}^{L} y^*_{k-l}(\Delta\tau)} +$$

$$\frac{(1-\alpha)\sum_{l=-L}^{L} y^*_{k-l}(\Delta\tau)}{\alpha\left[\sum_{l=-L}^{L} y^*_{k-l}(\Delta\tau)\right]^2} \sum_{l=-L}^{L}\sum_{m=0}^{N-1}(S(m)-S_k(m))u^*_{l,m}.$$

In said joint adaptive timing recovery loop, the value of $\sum_{l=-L}^{L} y^*_{k-l}(\Delta\tau)$ is always monitored. If $|\sum_{l=-L}^{L} y^*_{k-l}(\Delta\tau)| < \Delta$, the calculation of Equation (26) is switched to $$Z_k = \frac{(1-\alpha)\sum_{l=-L}^{L}\sum_{m=0}^{N-1}<I^*_{k-m}I_k>_k u^*_{l,m} y_{k-l}(\Delta\tau)}{\alpha \sum_{l=-L}^{L} |y_{k-l}(\Delta\tau)|^2} - \tag{27}$$

$$\frac{(1-\alpha)\sum_{l=-L}^{L}\sum_{m=0}^{N-1}(S(m)-S_k(m))<I_{k-m}y^*_{k-l}(\Delta\tau)>_k y_{k-l}(\Delta\tau)}{\alpha \sum_{l=-L}^{L} |y^*_{k-l}(\Delta\tau)|^2} -$$

$$\frac{(1-\alpha)\sum_{l=-L}^{L}\sum_{m=0}^{N-1}(S(m)-S_k(m))u^*_{l,m}y_{k-l}(\Delta\tau)}{\alpha \sum_{l=-L}^{L} |y^*_{k-l}(\Delta\tau)|^2} +$$

$$\frac{2(1-\alpha)\left\{\sum_{l=-L}^{L} y^*_{k-l}(\Delta\tau)y_{k-l}(\Delta\tau)\right\}}{\alpha\left[\sum_{l=-L}^{L} |y_{k-l}(\Delta\tau)|^2\right]^2} \cdot$$

$$\sum_{l=-L}^{L}\sum_{m=0}^{N-1}(S(m)-S_k(m))u^*_{l,m}y_{k-l}(\Delta\tau).$$

By now, in the first part of the preferred embodiments, a novel adaptive system filtering device or alternatively called an adaptive blind equalizer has been presented, whereby said direct control over the characteristics of overall adaptive system S 13 is carried out by means of minimizing error $\epsilon$ 20 with an unknown data training. Due to the fulfilment of said direct control over the characteristics of overall adaptive system S 13 by said adaptive system filtering device automatically tracking the minimum $\epsilon$ 20 in Equation (2), a joint operation of said adaptive channel encoder and said MLSE processor can be achieved with an unknown data training. More details of it will be described in the following second part of the preferred embodiments.

When adaptive system filtering device c 14 works with error $\epsilon$ 20 in Equation (2) whose system reference $\{S(m)\}$ is in a partial response signaling format, overall adaptive system S 13 turns into said adaptive convolutional channel encoder, as shown in FIG. 5. In FIG. 5, there is a simplified diagram for said joint operation of said adaptive channel encoder and said MLSE processor with an unknown data training, whereby a joint optimization can be realized. Thus, signal $\{\hat{I}_k\}$ 17 from adaptive system filtering device c 14 contains not only the information of current input data $\{I_k\}$ but also the information of previous N−1 input data $\{I_n\}$ for n=k−1, ..., k−N+1. A Viterbi sequential estimation algorithm is operated on the output of adaptive system filtering device c 14 to form an MLSE processor 27 instead of using a conventional decision device making a symbol-by-symbol detection.

In said overall adaptive system shown in FIG. 5, said adaptive channel encoder is controlled by adaptive system filtering device c 14 tracking an ideal system reference $\{S(m)\}$ for m=0, 1, ..., N−1 without increasing a transmission overhead. Since said ideal system reference $\{S(m)\}$ for m=0, 1, ..., N−1 can be selected to have spectral nulls at places where the spectral nulls of transmission channel h 12 are located, said adaptive channel encoder and said MLSE processor can be operated jointly over a spectral-null transmission channel by an unknown data training. Thus, said joint operation of said adaptive channel encoder and said MLSE processor enlarges the application class in which the conventional adaptive equalization processes are applied. Since the adaptive convolutional channel encoder and the adaptive MLSE processor are operated on one and the same error estimation criterion of $\epsilon$ 20 in said direct control over the characteristics of overall adaptive system S 13, said joint optimization can be reached. In contrast, said joint optimization is out of the question in a conventional communication system wherein an adaptive equalization process and an MLSE receiving process are operated simultaneously, but with respective error estimation criteria.

Now, an implementation example of said joint operation of said adaptive channel encoder and said MLSE processor by means of an unknown data training is in position.

IMPLEMENTATION EXAMPLE II

In the broadest sense, information source $\{X_k\}$ at the input port 23 of a transmitter encoder is characterized by a QAM signaling format. In the present example, the transmission of $\{X_k\}$ is carried out over a 16-point QAM system and the ideal signal constellation of 16-point QAM for said information source $\{X_k\}$ is given in FIG. 2A that the input symbol set consists of the points $$\{X_k\} = \{1 \pm j, -1 \pm j, 1 \pm 3j, -1 \pm 3j, 3 \pm j, -3 \pm j, 3 \pm 3j, -3 \pm 3j\}. \quad (28)$$

An signal mapping procedure carried out by signal mapping device 24 is described by the following rule $$a_k = \begin{cases} 0, & X_k = -3; \\ 1, & X_k = -1; \\ 2, & X_k = 1; \\ 3, & X_k = 3; \end{cases} \quad (29)$$

and $$\tau a_k = \begin{cases} 0, & \tau X_k = -3; \\ 1, & \tau X_k = -1; \\ 2, & \tau X_k = 1; \\ 3, & \tau X_k = 3. \end{cases} \quad (30)$$

Set an initial value of a complex symbol sequence $\{b_k\}$ as $b_0 = b_0 + j\ b_0 = 0$, a precoding process is carried out as $$b_k = a_k - b_{k-1}, \text{(Mod 4)}$$

$$b_k = a_k - b_{k-1} \text{(Mod 4)} \quad (31)$$

by precoding device 26. At input port 11 of said transmission channel, a transmitted signal $\{I_k\}$ at the kth moment is precoded that $$I_k = 2\ b_k - (M-1) + j[2\ b_k - (M-1)] \quad (32)$$

for $M = \sqrt{16}$ in a scenario of 16-point QAM signal transmission. From Equation (32), the precoded signal set $\{I_k\}$ is also of 16 points in the complex domain. In the present example, said ideal system reference for the characteristics of overall adaptive system S 13 is set in said class I partial response signaling format that $$S(m) = 1 \quad (33a)$$

for m=0 or 1; otherwise, $$S(m) = 0. \quad (33b)$$

Adaptive sampling device 40 takes a demodulated signal sequence from transmission channel h 12 as its input and generates sampled signal sequence $\{y_k\}$ 16. The operation of adaptive system filtering device c 14 follows the descriptions given in the first part of the preferred embodiments, except with a different calculation of symbol sequence $\{I_k\}$ which will be described and demonstrated later on in this second part of the preferred embodiments. Since the characteristics of overall adaptive system S 13 is set in said class I partial response signaling format defined in Equation (33), adaptive system filtering device c 14 tracks said ideal system reference for S 13 by minimizing error $\epsilon$ 20 which is defined in Equation (2). Thus, an adaptive convolutional channel encoding process is realized at the receiving end by the transmission of signal sequence $\{I_k\}$ through overall adaptive system S 13.

Figure 2B:
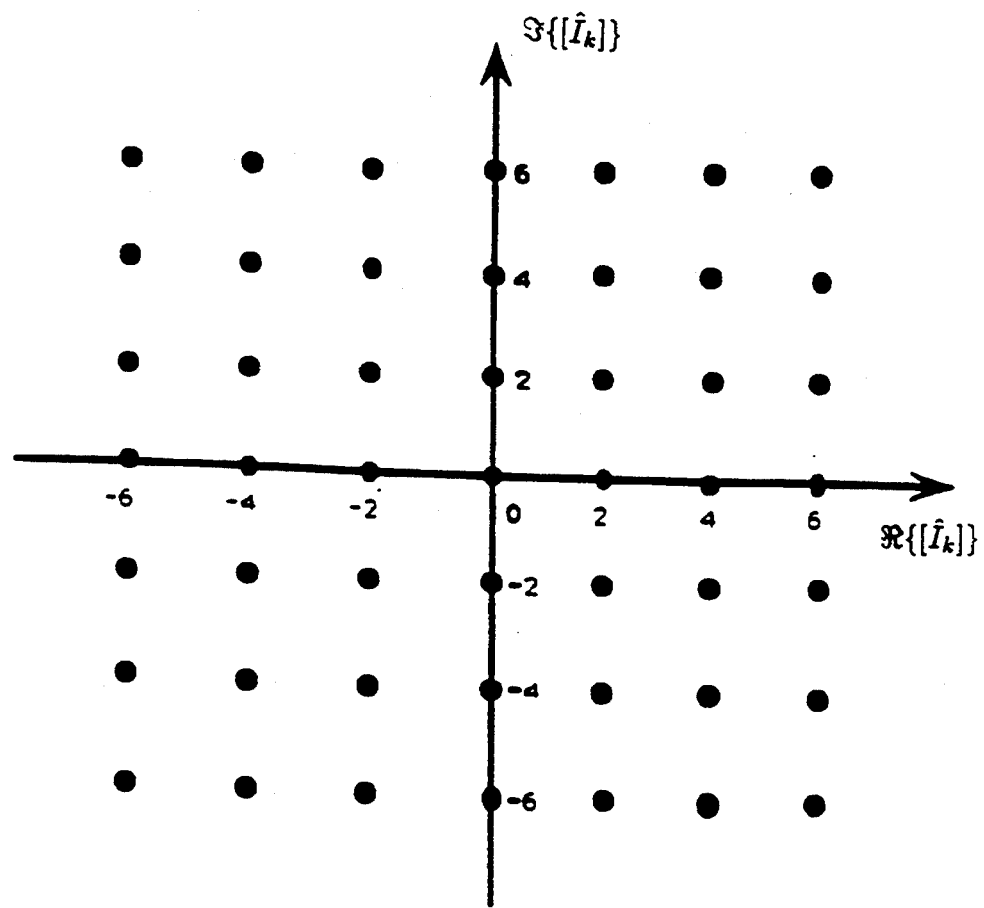
FIG. 2B shows a signal point constellation of the class I partial response signaling system with respect to a 16-point QAM signal transmission, which is used to illustrate the examples in the embodiments of the present invention.

Due to the transmission of $\{I_k\}$ in said class I partial response signaling format and corresponding adaptive convolutional channel encoding process, the set of all possible states for signal sequence $\{\hat{I}_k\}$ 17 expands beyond that of input signal sequence $\{I_k\}$ to transmission channel h 12. In this example of 16-point QAM transmission over an adaptive class I partial response signaling system, a state diagram of possible $\{\hat{I}_k\}$ 17 is given in FIG. 2B. There are totally 49 possible states of signal sequence $\{\hat{I}_k\}$ rather than the original 16 possible states of input signal sequence $\{I_k\}$ to transmission channel h 12 shown in FIG. 2A.

Instead of a symbol-by-symbol detection via decision device 18 with decision thresholds, signal sequence $\{\hat{I}_k\}$ 17 enters into MLSE processor 27 wherein the so-called soft decision decoding (SDD) process generates output symbol sequence $\{[\hat{I}_k]\}$ 28 from MLSE processor 27.

The purpose of running MLSE processor 27 is to minimize the probability of error in symbol sequence $\{[\hat{I}_k]\}$ 28 with respect to input signal sequence $\{I_k\}$ to transmission channel h 12. With a pre-determined SDD tracking length, LEN, e.g., LEN=30, an adaptive MLSE process proceeds. By the state transition table given in FIG. 4, we compare output signal $\hat{I}_k$ 17 with current possible states $\{[\hat{I}_k]\}$ 28 and set forth a SDD metric. A subset of current possible states $\{[\hat{I}_k]\}$ is determined by a previous state $[\hat{I}_{k-1}]$. Said SDD metrics are formed that $$\epsilon_{i,j,k} = |I_k - [I_k]|^2. \tag{34}$$

Integer number j is assigned for j=1, 2, ..., jmax, and jmax is the total possible states of $\{[\hat{I}_k]\}$ determined by said previous state $\{[\hat{I}_{k-1}]\}$ on the ith path. For example, we have jmax=16 for $[\hat{I}_{k-1}]=(-6,6)$ and jmax=49 for $[\hat{I}_{k-1}]=(0,0)$ from FIG. 4. After the calculation of Equation (34), said SDD metric is updated and a surviving SDD metric is selected by $$\epsilon_i = min\{\epsilon_i + \epsilon_{i,j,k}\} \tag{35}$$

for all i and possible j's. Index i is assigned for i=1,2, ..., imax, and integer imax indicates the number of total possible surviving paths in said SDD process. In this example, integer imax is upper limited by 49.

According to the SDD surviving rule of $min\{\epsilon_i\}$ at the kth iteration in Equation (35), a delayed decision $[\hat{I}_{k-LEN}]$ 28 is then made by MLSE processor 27 and sent to decoding device 29. In other words, said delayed decision $[\hat{I}_{k-LEN}]$ is a signal point on the surviving path with $min\{\epsilon_i\}$ among all existing paths of $\epsilon_i$'s. The SDD surviving rule described above can be understood by a Trellis tree search diagram, which is illustrated in an article entitled "The Viterbi Algorithm," authored by G. D. Forney Jr., Proceedings of the IEEE, vol. 61, No. 3, March 1973, pp.268-278. In order to prevent a possible error propagation in the final decision symbol $\{X_k\}$ due to an adaptive partial response channel encoding, a decoding and an inverse signal mapping processes are implemented. In this example, said decoding process is carried out by the following rule $$a_k = \frac{[I_k]}{2} + (M-1)(1+j) \quad (\text{Mod } 4) \tag{36}$$

where M is equal to $\sqrt{16}=4$ for a 16-point QAM communication system. The notation (.) stands for an estimate of the original signal point (.). Said inverse signal mapping is then applied to recover the original data symbol $\{X_k\}$ that $$X_k = \begin{cases} -3, & a_k = 0; \\ -1, & a_k = 1; \\ 1, & a_k = 2; \\ 3, & a_k = 3; \end{cases} \tag{37}$$

and $$\tau X_k = \begin{cases} -3, & \tau a_k = 0; \\ -1, & \tau a_k = 1; \\ 1, & \tau a_k = 2; \\ 3, & \tau a_k = 3. \end{cases} \tag{38}$$

Said decoding and inverse signal mapping processes described in Equations (36) to (38) are not at all involved in the previous symbol decision. Thus, said possible error propagation in said adaptive partial response signaling system is prevented.

Despite the fact that said signal sequence $\{I_k\}$ does not appear explicitly in FIG. 5, $\{I_k\}$ is still indispensable in implementation example II. The explanation thereof is this. For said direct control over the characteristics of overall adaptive system S 13, said symbol sequence $\{I_k\}$ is used for error $\epsilon$ 20 defined in Equation (2) to estimate said $\{S_k(m)\}$ in Equation (13) and $Z(I_k)$ in Equations (15) and (16). Due to said adaptive convolutional channel encoding process in an adaptive partial response signaling format in said joint operation with the MLSE receiving process, a symbol sequence $\{I_k\}$ is the estimate of precoded symbol sequence $\{I_k\}$ at 11. Thus, said symbol sequence $\{I_k\}$ is obtained from the following procedures.

Based on the complex result of ($\hat{a}_k$, $\hat{a}_k$) from Equation (36), a complex symbol sequence $\{b_k\}$ is calculated that $$b_k = a_k - b_{k-1}, (\text{Mod } 4)$$

$$b_k = a_k - b_{k-1}, (\text{Mod } 4) \tag{39}$$

where said complex symbol sequence $\{b_k\}$ starts with $b_0 = b_0 + j\ b_0 = 0$. Said symbol sequence $\{I_k\}$ is then formed that $$I_k \overset{\triangle}{=} b_k - (M-1) + j[2\ b_k - (M-1)]. \tag{40}$$

In this example, $M = \sqrt{16}$ is applied to a scenario of 16-point QAM signal transmission. The calculation of $\{I_k\}$ shown in Equation (40) for error $\epsilon$ 20 relates to implementation example II; and this should be distinguished from the symbol-by-symbol threshold decision that is described in implementation example I.

Figure 6:
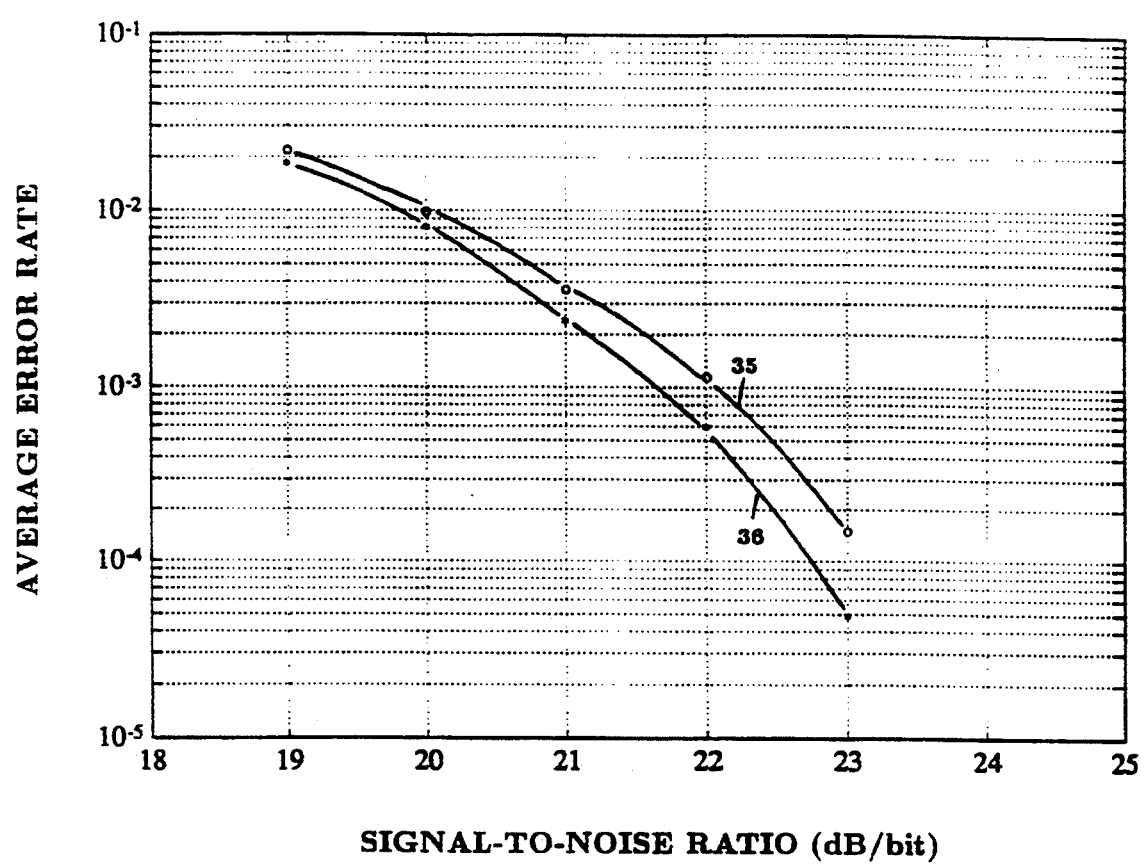
FIG. 6 shows a chart of performance evaluation whereby comparisons can be made between said joint operation of said adaptive channel encoder and said MLSE by means of an unknown data training 36, and an adaptive blind equalization process using a partial response signaling format and a symbol-by-symbol decision 35.

To conclude, we are now going to compare the performances in the following two cases. One is an adaptive blind equalization process which is operated by a symbol-by-symbol detection scheme, and the other is the joint adaptive processes with an unknown data training which is just described in this implementation example II. In terms of average error rate versus signal-to-noise ratio, their performances are evaluated by computer simulations and shown by two curves 35 and 36 in FIG. 6. Curve 35 is given for the former case, and curve 36 for the latter, while both adaptive processes proceed in said class I partial response signaling format defined by said ideal system reference given by Equations (33a) and (33b). It can be seen from the comparison between curves 35 and 36 that said joint operation of said adaptive channel encoder with said adaptive system filtering device and said MLSE processor of the present invention has achieved an improved system performance regarding average error rate versus signal-to-noise ratio.

I claim:

1. In an adaptive receiver for use in an automatic and reliable detection of data signals coming through a transmission channel whose channel characteristics is dynamic and unknown, whereupon said adaptive receiver includes a receiver sampler and an adaptive system filtering device in series which concatenate said transmission channel to form an overall adaptive system connected to a decision device of said adaptive receiver for producing detected data symbols, and which enable an adaptive control over the unknown characteristics of said overall adaptive system under the guidance of an error estimation criterion underlying the present invention, a method of effecting an adaptive adjustment of the characteristics of said adaptive system filtering device with an unknown data training, comprising the steps of:
   (a) choosing an ideal system reference for the characteristics of said overall adaptive system by a user of said adaptive receiver,
   (b) making an adaptive estimate of the characteristics of said overall adaptive system with said unknown data training,
   (c) forming an error measurement on the basis of said error estimation criterion when the results in steps (a) and (b) are available, and
   (d) using a signal resulting from said error measurement in step (c) as a control signal which is fedback to said adaptive system filtering device such that its characteristics will be adjusted and hence the characteristics of said overall adaptive system will be under said adaptive control according to said ideal system reference referred to in step (a).

2. Method according to claim 1, characterized in that
   (a) a basic part of said error estimation criterion underlying the present invention is defined as an error function based on the difference between said adaptive estimate of the characteristics of said overall adaptive system pointed out in claim 1 step (b) and said ideal system reference pointed out in claim 1 step (a),
   (b) said adaptive estimate of the characteristics of said overall adaptive system has been formulated in terms of sampled input and output signals of said adaptive system filtering device and detected data symbols from said decision device, all of which are unknown yet measurable quantities, and
   (c) said error estimation criterion has been extended to an extended error estimation criterion by adding to said basic part defined on a system-characteristics basis in (a) a second term which is defined with respect to both symbol-by-symbol basis formed by a comparison between a function of detected data symbol and an estimated symbol, and system-characteristics basis, gaining advantages of:
      (c$_1$) being able to weight said basic part of the extended error estimation criterion by a numerical factor and said second term of said extended error estimation criterion by another numerical factor to render the flexibility of said extended error estimation criterion in application,
      (c$_2$) maintaining validity of said adaptive control over the unknown characteristics of said overall adaptive system stated in claim 1 when said extended error estimation criterion is used instead of said error estimation criterion originally used in claim 1, defined in (a) of claim 2,
      (c$_3$) improving convergence properties of said adaptive adjustment of the characteristics of said adaptive system filtering device and said adaptive control over the characteristics of said overall adaptive system, and
      (c$_4$) being capable of presenting the result of an adaptive procedure by a conventional MSE criterion with a known data training the same as what said adaptive procedure converges to by said extended error estimation criterion with an unknown data training.

3. Method according to claim 2, characterized in that when an adaptive sampling device is used instead of said receiver sampler and augmented with a division device, a differentiator, an adaptive timing adjustment device, an adder, and a duplicate of said adaptive system filtering device to form an adaptive timing recovery loop, there is a joint working of the following two adaptive processes
   (a) said adaptive adjustment of the characteristics of said adaptive system filtering device, and
   (b) an adaptive adjustment of timing in said adaptive sampling device
to support each other by the same extended error estimation criterion with an unknown data training, regardless of whether a sampling rate is set to a value that is equal to or higher than input signal rate to said overall adaptive system.

4. Method according to claim 1, characterized in that an adaptive process is designed for updating the characteristics of said adaptive system filtering device by said error estimation criterion to such an extent that the adaptive algorithms, which are underlying said adaptive process, can be set into a storage area of said adaptive system filtering device and executed by the logic circuits built in said adaptive system filtering device when said control signal is applied to said adaptive system filtering device as stated in claim 1 step (d).

5. Method according to claim 1, characterized in that there is a system identification model in the sense that when unknown characteristics of said transmission channel and a system are to be identified, they can be derived from the knowledge of the characteristics of both said adaptive system filtering device and said overall adaptive system which is made available by operating said system identification model by:
   (a) sending a data sequence, which is unknown at the receiving end of said transmission channel and said system, as input to said transmission channel and said system to excite said overall adaptive system, namely, said system identification model, and producing an output signal at the output end of said system identification model,
   (b) adjusting adaptively the characteristics of said adaptive system filtering device according to said output signal from step (a) of claim 5 and evaluating the adjustment result according to said extended error estimation criterion, and concurrently
   (c) controlling adaptively the characteristics of said overall adaptive system towards said ideal system reference chosen by a user intending to do said system identification.

6. For a digital communication system using a quadrature amplitude modulation (QAM) technique which is a concatenation of a transmission channel of unknown characteristics and a receiving apparatus wherein an adaptive convolutional channel encoding process and an adaptive compensation process for the working of said receiving apparatus are concurrently optimized with an unknown data training in their operation under the guidance of the extended error estimation criterion underlying the present invention, an apparatus for realizing the joint optimization of the two processes just stated, characterized in that it includes:

means for carrying out said adaptive convolutional channel encoding process through an adaptive channel encoder, which is formed by the concatenation of said transmission channel, and an adaptive system filtering device within said receiving apparatus, wherein the unknown characteristics of said digital communication system performed as said adaptive channel encoder is under adaptive control by the extended error estimation criterion with said unknown data training and wherefore a user of said apparatus has to specify a system reference involved in the extended error estimation criterion, and means for carrying out said adaptive compensation process through an adaptive sampling device within an adaptive timing recovery loop for the working of said receiving apparatus by the extended error estimation criterion whose system reference has been specified by said user of said apparatus.

7. Apparatus according to claim 6, characterized in that said receiving apparatus includes an adaptive sampling device and an adaptive system filtering device in series which concatenate said transmission channel to form said digital communication system connected to a decision device of said receiving apparatus such that when said user's specification of said system reference required for the extended error estimation criterion is an ideal system reference of a partial response signaling format, said digital communication system forms an adaptive convolutional channel encoder by the extended error estimation criterion in the sense that input signals to said digital communication system are transformed by convolution of the characteristics of said transmission channel and said adaptive system filtering device and are thus encoded in a manner determined by said user's specification of said ideal system reference of said partial response signaling format in the extended error estimation criterion.

8. Apparatus according to claim 7, characterized in that the extended error estimation criterion used for said adaptive system filtering device to control the characteristics of said adaptive convolutional channel encoder provides a means to match the distribution of spectral nulls if any in the characteristics of said transmission channel with spectral nulls of the characteristics of said adaptive convolutional channel encoder whose locations are controllable.

9. Apparatus according to claim 6, characterized in that said adaptive sampling device in claim 7 operated within an adaptive timing recovery loop, which is formed by the concatenation of said adaptive sampling device, a division device, a differentiator, an adaptive timing adjustment device, an adder, said adaptive system filtering device, a duplicate of said adaptive system filtering device, and said decision device, plays the role of an adaptive system compensator to carry out said adaptive compensation process for the working of said receiving apparatus by using the same extended error estimation criterion in claim 7.

10. For an automatic, flexible and reliable digital communication system using a QAM technique which is formed by the concatenation of a transmitter encoder, a transmission channel of unknown characteristics and a receiving apparatus wherein an adaptive convolutional channel encoding process, an adaptive compensation process for the working of said receiving apparatus and a maximum likelihood sequence estimation (MLSE) process are concurrently optimized with an unknown data training in their operation under the guidance of the extended error estimation criterion underlying the present invention, an apparatus for realizing the joint optimization of the three processes just stated, characterized in that it includes:

means for carrying out said adaptive convolutional channel encoding process through an adaptive convolutional channel encoder wherein the characteristics of said adaptive convolutional channel encoder, which is formed by the concatenation of said transmission channel, an adaptive sampling device and an adaptive system filtering device within said receiving apparatus, is under adaptive control by the extended error estimation criterion with said unknown data training and wherefore a user of said receiving apparatus has to specify an ideal system reference involved in the extended error estimation criterion, means for carrying out said adaptive compensation process which is jointly implemented by said adaptive sampling device and said adaptive system filtering device within said receiving apparatus to support said adaptive convolutional channel encoding process by the extended error estimation criterion whose ideal system reference has been specified by said user of said receiving apparatus, and means for carrying out said MLSE process which is implemented by an MLSE receiver-decoder to remove the possibility of an error propagation in a partial response signaling system and to support said adaptive compensation process.

11. Apparatus according to claim 10, characterized in that said receiving apparatus includes an adaptive sampling device and an adaptive system filtering device in series with an MLSE receiver-decoder as a soft decision device, wherein an adaptive timing recovery loop for said adaptive compensation process is formed by the concatenation of said adaptive sampling device, a division device, a differentiator, an adaptive timing adjustment device, an adder, said adaptive system filtering device and its duplicate, while said convolutional channel encoding process is carried out in the combination of said transmission channel, said adaptive sampling device and said adaptive system filtering device.

12. Apparatus according to claim 10, characterized in that in order to remove the possibility of said error propagation at the output of said receiving apparatus for a partial response signaling transmission system, said transmitter encoder which comprises a signal mapping device and a precoding device is installed at the input of said transmission channel, while said MLSE receiver-decoder which comprises an MLSE processor, a decoding device and an inverse mapping device is used as said soft decision device of said receiving apparatus for said MLSE process.

* * * * *